(12) United States Patent
Mumper et al.

(10) Patent No.: US 9,397,668 B2
(45) Date of Patent: Jul. 19, 2016

(54) SYSTEM AND METHOD FOR PROVIDING PROGRAMMABLE SYNCHRONOUS OUTPUT DELAY IN A CLOCK GENERATION OR DISTRIBUTION DEVICE

(71) Applicant: Linear Technology Corporation, Milpitas, CA (US)

(72) Inventors: Eric Wright Mumper, Plano, TX (US); Jan-Michael Stevenson, Lucas, TX (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 14/574,893

(22) Filed: Dec. 18, 2014

(65) Prior Publication Data

US 2016/0182056 A1 Jun. 23, 2016

(51) Int. Cl.
*H03K 21/00* (2006.01)
*H03K 23/00* (2006.01)
*H03K 25/00* (2006.01)
*H03K 21/02* (2006.01)
*H03K 19/173* (2006.01)

(52) U.S. Cl.
CPC .......... *H03K 21/026* (2013.01); *H03K 19/1737* (2013.01)

(58) Field of Classification Search
USPC ......... 327/115, 116, 117, 118, 355–361, 202, 327/203, 208–212, 218; 377/47, 48
See application file for complete search history.

(56) References Cited

U.S. PATENT DOCUMENTS

| 6,049,238 | A | * | 4/2000 | Shimizu | H03K 3/027 327/115 |
| 6,100,622 | A | * | 8/2000 | Yamamoto | H02N 2/14 310/316.01 |
| 2005/0024908 | A1 | * | 2/2005 | Gizara | H05K 1/0292 363/147 |
| 2005/0162957 | A1 | * | 7/2005 | Oh | G11C 11/406 365/222 |
| 2005/0165996 | A1 | * | 7/2005 | Vergnes | G06F 13/4217 710/306 |
| 2008/0191671 | A1 | * | 8/2008 | Shikata | G05F 1/56 323/273 |
| 2010/0052739 | A1 | * | 3/2010 | Shibata | G11C 7/1072 327/117 |

\* cited by examiner

*Primary Examiner* — Brandon S Cole
(74) *Attorney, Agent, or Firm* — Edward C. Kwok; Hogan Lovells US LLP

(57) ABSTRACT

A clock frequency division circuit receives delay value, synchronization signal, and external clock signal of a given frequency. The clock division circuit includes (a) a decode circuit receiving delay value and providing set of initial count values; (b) one or more counters each receiving input clock signal derived from the external clock signal and providing frequency divided output signal having a frequency a fraction of the given frequency, and each receiving a corresponding one of the initial count values, and wherein, subsequent to detecting a transition in the synchronization signal, each counter provides transition in the frequency divided output signal after a time period represented by corresponding initial count value; and (c) synchronization circuit that is reset by the synchronization signal, the synchronization circuit providing a gating signal enabling output of the frequency divided output signal after expiration of initial count value. The one or more counters may be cascaded.

5 Claims, 5 Drawing Sheets

SYSTEM AND METHOD FOR PROVIDING PROGRAMMABLE SYNCHRONOUS OUTPUT DELAY IN A CLOCK GENERATION OR DISTRIBUTION DEVICE

BACKGROUND OF THE INVENTION

1. Field of the Invention

The present invention relates to methods for providing, in a clock generation or distribution circuit, a synchronous delay in an output clock signal relative to a synchronization signal.

2. Discussion of the Related Art

Clock generation or distribution circuits are often required to synchronize its output signals relative to a reference synchronization signal. It is also often desirable to delay one output signal relative to another to achieve specific objects, such as to optimize set-up and hold times, or to create quadrature (90° phase shifted) signals. The required delay may be provided as a fine "analog" delay or a coarse but accurate "digital" delay. An analog delay is usually achieved by adding gate propagation delays in small steps. Consequently, such delays are generally difficult to control to precision, especially the circuit operates over a wide temperature range. In contrast, the digital delay may be controlled to greater precision and is repeatable. Often, the digital delay is provided by an integer number of periods of the input clock signal.

FIG. 1 illustrates a method for providing a digital delay in an output signal relative to synchronization signal SYNC in clock frequency division circuit 100. As shown in FIG. 1, clock frequency division circuit 100 includes divider 101, delay counter 102, and output flip-flop 103. In clock frequency division circuit 100, when synchronization signal SYNC becomes active, delay counter 102 counts down from an initially loaded delay value. Until delay counter 102 reaches zero, delay counter 102 holds divider 101 in a reset mode by asserting a "wait" signal at terminal 104. When delay counter 102 reaches zero, delay counter 102 de-asserts the wait signal at terminal 104 to enable divider 101 to provide a valid output signal, which is then synchronized with the input clock signal by output flip-flop 103. Under this approach, delay counter 102 operates at the same frequency as divider 101, and thus poses the same level of design difficulty—and is similarly power-intensive—as divider 101. Furthermore, delay counter 102 requires additional silicon area, which may be as much as the silicon area occupied by divider 101.

SUMMARY

According to one embodiment of the present invention, a clock frequency division circuit in a clock generation or distribution circuit receives a delay value, a synchronization signal, and an external clock signal of a given frequency. The clock division circuit includes (a) a decode circuit receiving the delay value and providing a set of initial count values; (b) one or more counters each receiving an input clock signal derived from the external clock signal and providing a frequency divided output signal that has a frequency that is a fraction of the given frequency, and each receiving a corresponding one of the initial count values, and wherein, subsequent to detecting a transition in the synchronization signal, each counter provides a transition in the frequency divided output signal after a time period represented by the corresponding initial count value; and (c) a synchronization circuit that is reset by the synchronization signal, the synchronization circuit selecting one of the frequency divided output signals to provide as an output signal. The one or more counters may be cascaded.

In one embodiment of the present invention, the synchronization circuit of the clock frequency division circuit may include two or more D-flip flops each receiving the frequency divided output signal of an associated one of the counters and each being clocked by the input clock signal of the associated counter. Furthermore, the synchronization circuit may include an additional D-flip flop that is reset by the synchronization signal to a first logic state, the additional D-flip flop receiving at a clock input terminal an associated one of the frequency divided output signals of the counters, wherein the additional flip-flop changes to a second logic state complementary to the first logic state upon detecting a transition in the associated frequency divided output signal. The synchronization circuit gates the selected frequency divided output signal with the output signal of the additional D-flip flop to provide the output signal.

The present invention is better understood upon consideration of the detailed description below in conjunction with the accompanying drawings,

DETAILED DESCRIPTION OF THE PREFERRED EMBODIMENTS

Figure 1:
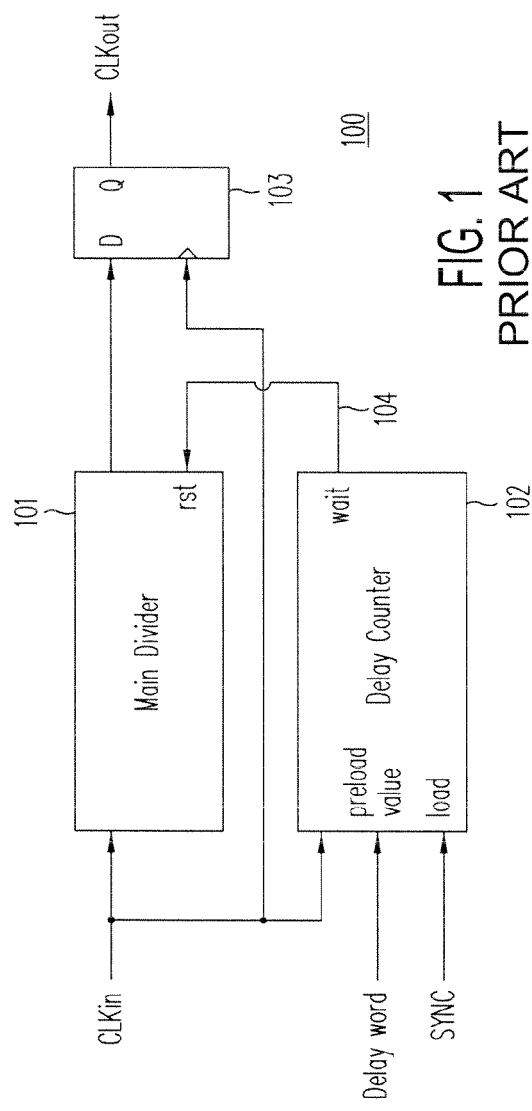
FIG. 1 illustrates a method for providing a digital delay to an output signal relative to synchronization signal SYNC in clock frequency division circuit 100.

The present invention provides a delayed clock signal without requiring a dedicated delay counter (e.g., delay counter 101 of FIG. 1). The present invention takes advantage of the fact that a main divider circuit in a clock frequency division circuit already includes one or more internal counters that are used in performing its assigned frequency division task. By presetting appropriate initial values in these internal counters, and gating the output signal of the divider circuit with an appropriate clock signal, the desired programmable delay is achieved.

Figure 2:
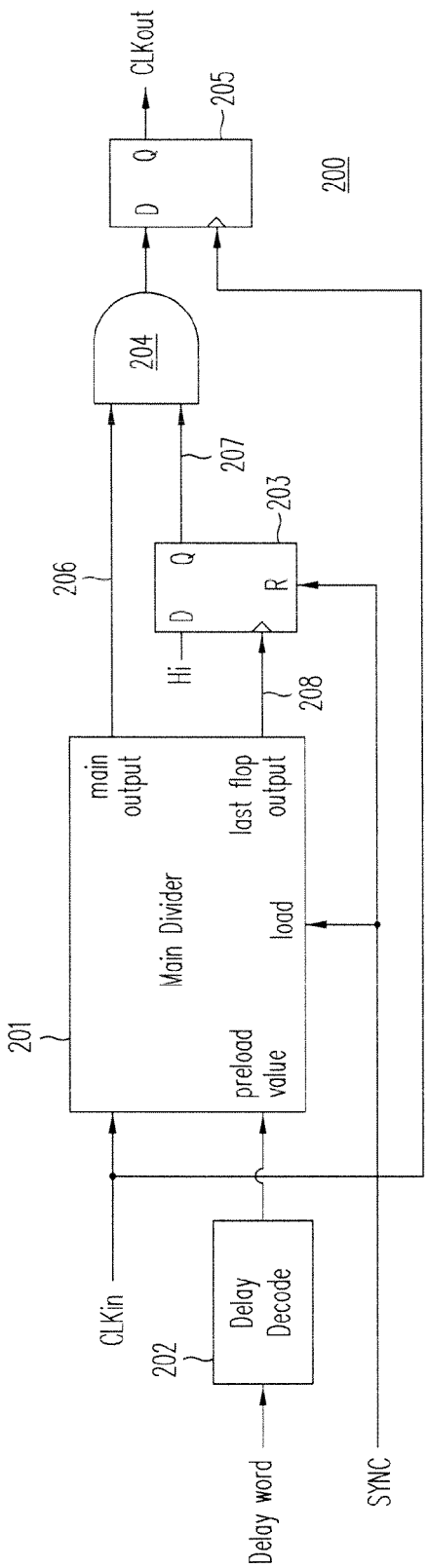
FIG. 2 shows clock frequency division circuit 200, which provides a synchronous delay in the output signal relative to synchronization signal SYNC, in accordance with one embodiment of the present invention.
Figure 3A:
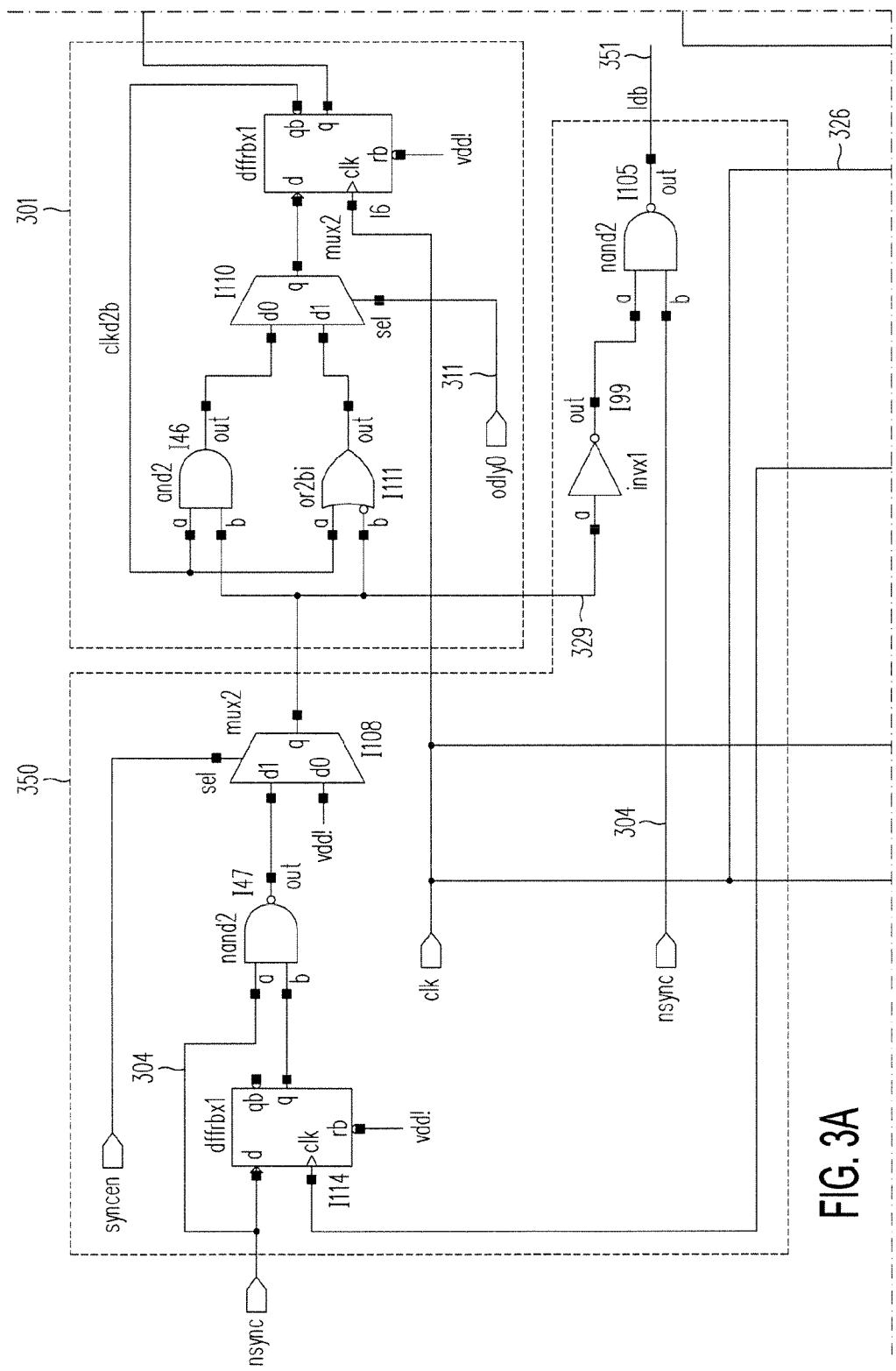
FIG. 3 is FIGS. 3A, 3B, 3C, and 3D taken together and is a schematic diagram that shows an implementation of clock frequency division circuit 300, in accordance with one embodiment of the present invention.
Figure 3B:
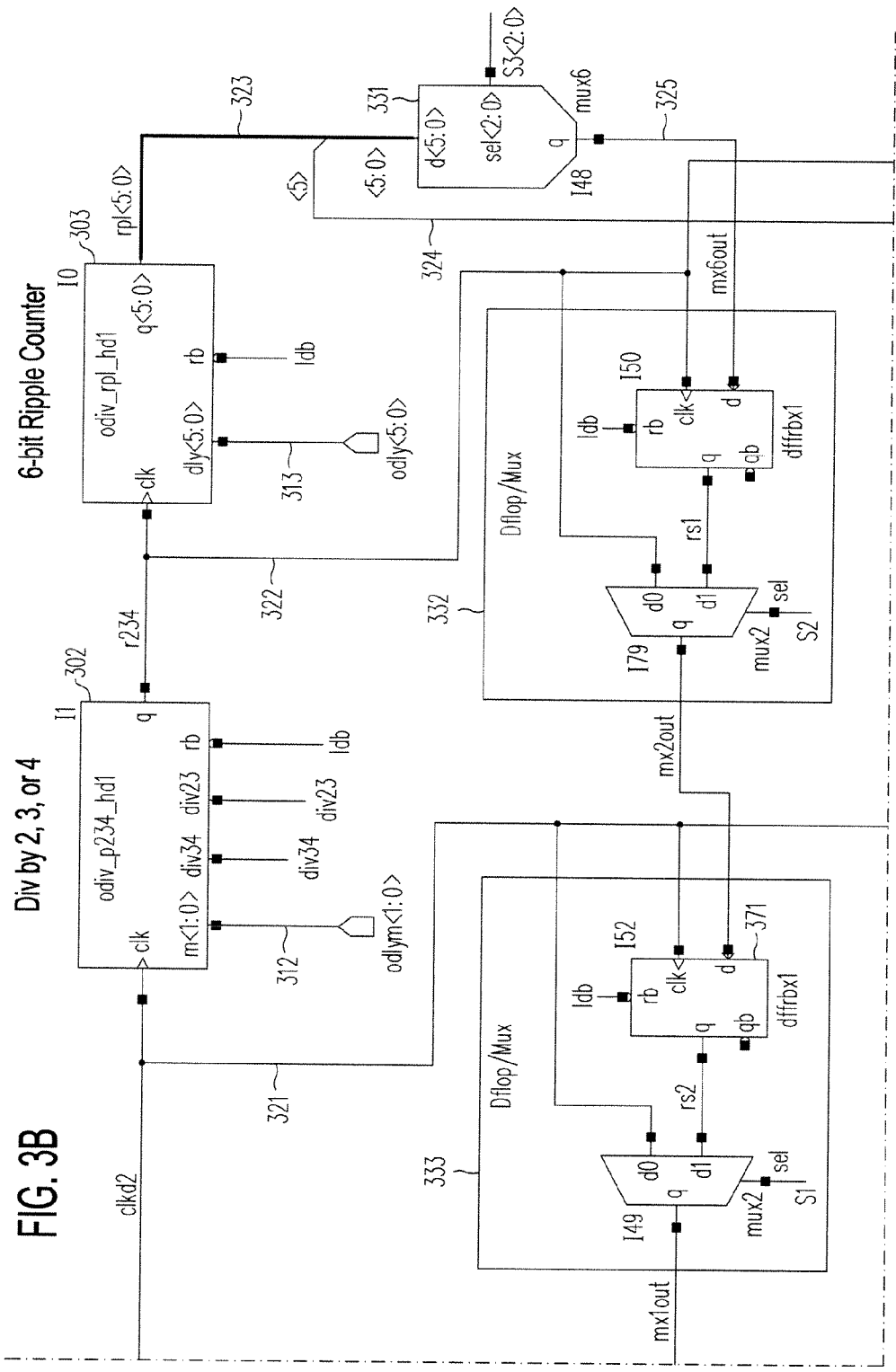
Figure 3C:
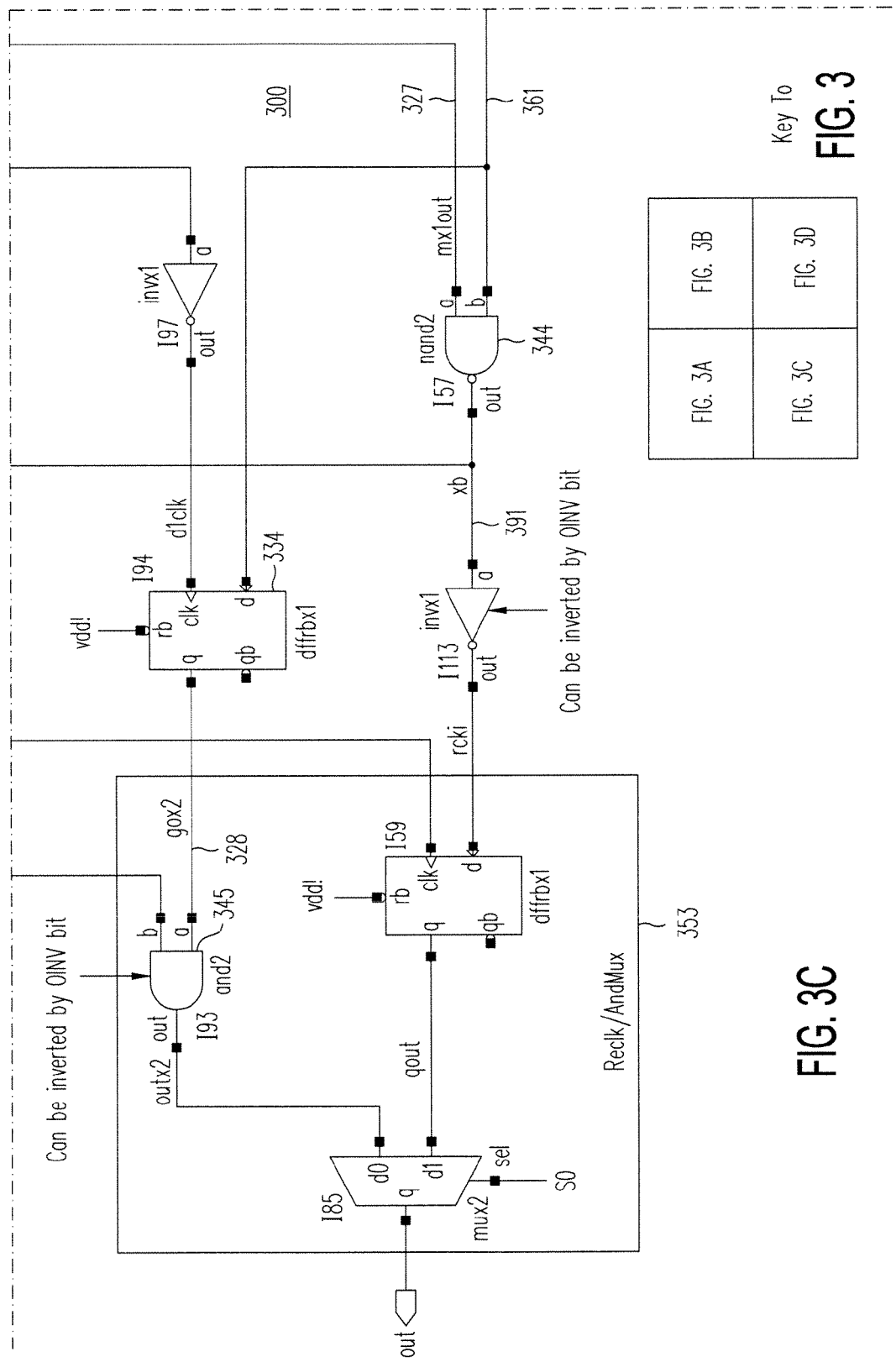
Figure 3D:
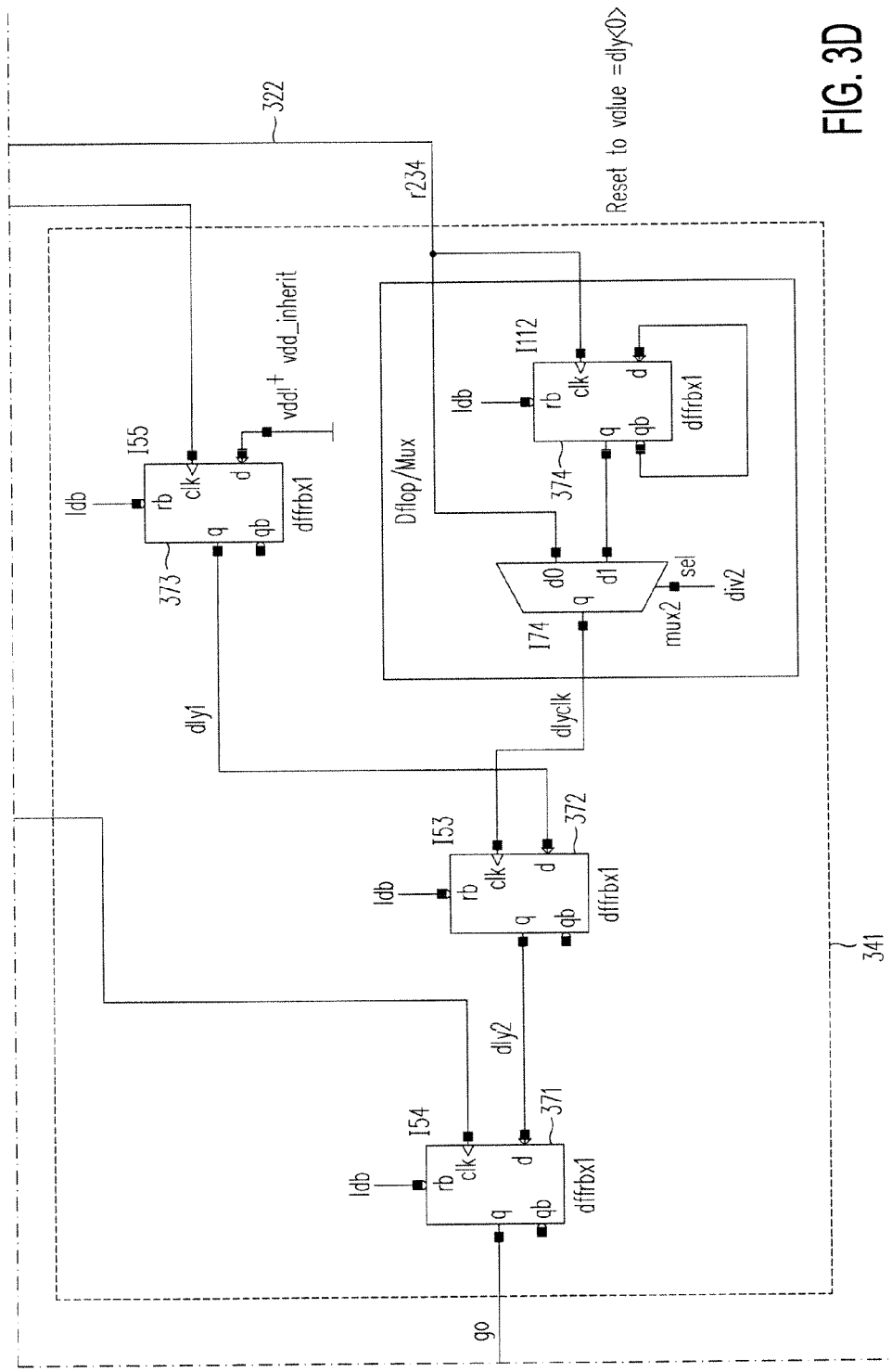

FIG. 2 is a block diagram of clock frequency division circuit 200, which provides a synchronous delay in the output signal relative to synchronization signal SYNC, in accordance with one embodiment of the present invention. As shown in FIG. 2, main divider 201 divides input clock signal CLKin down by a programmable divisor. Main divider 201 selects the output signal from one of the internal counters, based on the value of the programmable divisor. Decode circuit 202 receives an input delay value representing a desired programmable delay and provides a set of output signals that represent the appropriate initial delay values that are required at the respective internal counters of main divider 201 in order to preset the received input delay value. When synchronization signal SYNC becomes active, each internal counter loads its initial delay value and counts down from that initial delay value, so that its output signal becomes active at the expiration of its initial preset delay value. Simultaneously, active synchronization signal SYNC resets flip-flop 203, such that its output signal at terminal 207 is at logic '0', thus forcing the output value of AND gate 204 also to logic '0'. Main divider 201 provides at terminal 206, as its output frequency divided clock signal, the output signal of the internal counter corresponding to the desired programmable divisor. When the output signal of main divider 202 at terminal 208 becomes active (i.e., at the desired delay with respect to synchronization signal SYNC becoming active), it loads a logic '1' value into flip-flop 203, which enables the output frequency divided clock signal at terminal 206 to be made available to output flip-flop 205. Output flip-flop 206 synchronizes output clock signal CLKout—the output signal of clock frequency division circuit 200—to input signal CLKin.

Therefore, unlike clock frequency division circuit 100 of FIG. 1, clock frequency division circuit 200 does not require a dedicated delay counter. Furthermore, as decode circuit 202 may be implemented by low-frequency CMOS logic, decode circuit 202 does not pose the same level of design difficulty as main divider 201, and can be achieved without the power-intensity of a dedicated delay counter, such as delay counter 102.

FIGS. 3A, 3B, 3C, and 3D show an implementation of clock frequency division circuit 300, in accordance with one embodiment of the present invention. As shown in FIGS. 3A, 3B, 3C, and 3D, clock frequency division circuit 300 includes cascaded divide-by-2 circuit 301, divide-by-2, 3, or 4 circuit 302, and 6-bit counter 303. As the name implies, divide-by-2, 3 or 4 circuit 302 is a programmable circuit that can be programmed to perform frequency division by 2, 3 or 4. 6-bit counter 303 can be used to implement any of the frequency divisions by 2, 4, 8, 32, or 64. Therefore, clock frequency division circuit 300 provides an output clock signal that has a frequency that is the frequency of its input clock signal divided by a selected one of 1, 2, 4, 8, 12, 16, 24, 32, 48, 64, 96, 128, 192, 256, 384, and 512. Divide-by-2 circuit 301 and divide-by-2, 3 or 4 circuit 302 each may be implemented as a counter. Divide-by-2 circuit 301 and divide-by-2, 3 or 4 circuit 302 provides output signals at terminals 321 and 322, respectively. 6-bit counter 303 provides six output signals on 6-bit bus 323. 6-to-1 multiplexer 331 provides at terminal 325 the appropriate one of the bits of 6-bit bus 323 as the output signal of the frequency division performed at 6-bit counter 303.

Clock frequency division circuit 300 accepts a programmable delay value between 0 and 255. In this embodiment, the programmable delay value, which is represented by the signal values of signals odly0, odlym[1:0], and odly[5:0], is provided to divide-by-2 circuit 301 at terminal 311, divide-by-2, 3 or 4 circuit 302 at 2-bit bus 312 and 6-bit counter 303 at 6-bit bus 313. The programmable delay value may be specified in this embodiment by an unsigned 8-bit value DLY [7:0], which may be then decoded in a decode circuit to provide signals odly0, odlym[1:0] and odly[5:0]. In this embodiment, the decode circuit may implement the following set of logic equations:

When divide-by-2, 3 or 4 circuit 302 is set to divide by 2:

$odly0 = DLY[0]$ $oldym[1:0] = mod(DLY[7:1], 2)$ $odly[5:0] = int(DLY[7:1]/2)$

When divide-by-2, 3 or 4 circuit 302 is set to divide by 3:

$odly0 = DLY[0]$ $oldym[1:0] = mod(DLY[7:1], 3)+1$ $odly[5:0] = int(DLY[7:1]/3)$ When divide-by-2, 3 or 4 circuit 302 is set to divide by 4:

$odly0 = DLY[0]$ $oldym[1:0] = mod(DLY[7:1], 4)$ $odly[5:0] = int(DLY[7:1]/4)$ where mod( ) and int( ) represent the modulus function and the rounding-to-integer function, respectively.

The output signals of divide-by-2 circuit 301, divide-by-2, 3 or 4 circuit 302 and 6-bit counter 303 at terminals 321, 233 and 325, respectively, are selected by multiplexer-flip flops 332 and 333 to provide an output clock signal at terminal 327. This output clock signal at terminal 327 is the frequency divided output clock signal when clock frequency division circuit 300 is required to divide by 2, 4, 8, 12, 16, 24, 32, 48, 64, 96, 128, 192, 256, 384, or 512. The selected frequency divided output clock signal has also been appropriately synchronized to its own higher frequency input clock signal in multiplexer-flip flops 332 and 333. The output clock signal corresponding to a frequency division by 1 is provided by routing input clock signal CLK at terminal 326 through flip-flip 334, and is provided as an output signal of flip-flop 334 at terminal 328.

In this embodiment, synchronization signal nsync is released by synchronization enable signal syncen in synchronization circuit 350, to provide reset signal ldb at terminal 351. Initially, when synchronization signal nysnc becomes active, reset signal ldb resets flip-flops 371, 372, 373 and 374 (within reset circuit 341), such that reset circuit 341's output signal 361 is set to logic '0' which, in turn, sets the output signal of AND gate 344 also to logic '0'. Reset circuit 341 receives the output signal of divide-by-2 circuit 301 at terminal 321, the output signal of divide-by-2, 3 or 4 circuit 302 at terminal 322, and the highest frequency output signal of 6-bit counter 303 at terminal 324. When the programmed delay period expires, the D-input value (logic '1') is latched into flip-flop 373 and propagated through flip-flops 372 and 373 to set output signal 361 to logic '1', thereby enabling the delayed frequency divided clock signal at terminal 327 to propagate to multiplexer-flip flop 353, where it is synchronized with the input clock signal. Multipexer-flip flop 353 also selects between the divide-by-1 output signal and the delayed frequency divided clock signal to provide the final output.

One further advantage of the present invention provides that the desired delay may be set to a value that is greater than one period of the frequency divided output signal. For example, in circuit 300 of FIGS. 3A, 3B, 3C, and 3D, even when the desired frequency division is divide-by-2, the desired delay may be set to the maximum delay value of 255. In that instance, the signal transition of the highest frequency output signal of 6-bit counter 303 at terminal 324 becomes active at the expiration of the desired delay latches the logic '1' value at flip-flop 373, which is then propagated to AND gate 344 through flip-flops 372 and 371.

The above detailed description is provided to illustrate the specific embodiments of the present invention and is not intended to be limiting. Numerous modifications and variations within the scope of the present invention are possible. The present invention is set forth in the accompanying claims.

We claim:

1. A clock frequency division circuit, which receives a delay value, a synchronization signal, and an external clock signal of a given frequency, comprising:
   a decode circuit receiving the delay value and providing a set of initial count values;
   one or more counters each (a) being associated with a corresponding programmable divisor, (b) receiving an input clock signal derived from the external clock signal and a corresponding one of the initial count values, and (c) providing a frequency divided output signal that has a frequency that is the given frequency divided by the corresponding programmable divisor, wherein, subsequent to detecting a transition in the synchronization signal, each counter provides a transition in the respective frequency divided output signal after a time period represented by the corresponding initial count value; and
   a synchronization circuit that is reset by the synchronization signal, the synchronization circuit providing a gating signal that enables the frequency divided output signal to be output after expiration of the initial count value.

2. The clock frequency division circuit of claim 1, wherein the one or more counters are cascaded.

3. The clock frequency division circuit of claim 1, wherein the synchronization circuit comprises two or more D-flip flops each receiving the frequency divided output signal of an associated one of the counters and each being clocked by the input clock signal of the associated counter.

4. The clock frequency division circuit of claim 1, wherein the synchronization circuit comprises a flip-flop that is reset by the synchronization signal to a first logic state, the flip-flop receiving at a clock input terminal an associated one of the frequency divided output signals of the counters, wherein the flip-flop changes to a second logic state complementary to the first logic state upon detecting a transition in the associated frequency divided output signal.

5. The clock frequency division circuit of claim 4, wherein the synchronization circuit gates the selected frequency divided output signal with the output signal of the flip-flop to provide the output signal.

* * * * *